United States Patent
Mantell et al.

(10) Patent No.: US 10,939,593 B2
(45) Date of Patent: Mar. 2, 2021

(54) POWER SUPPLY FAN MANAGEMENT

(71) Applicant: The ESAB Group, Inc., Florence, SC (US)

(72) Inventors: Lee Roy Mantell, Essex, MD (US); Karunakar Reddy Gujja, Elkridge, MD (US); Roger Clinton Williamson, IV, Baltimore, MD (US)

(73) Assignee: The ESAB Group Inc., Florence, SC (US)

( * ) Notice: Subject to any disclaimer, the term of this patent is extended or adjusted under 35 U.S.C. 154(b) by 0 days.

(21) Appl. No.: 16/397,026

(22) Filed: Apr. 29, 2019

(65) Prior Publication Data

US 2020/0344921 A1    Oct. 29, 2020

(51) Int. Cl.
| | |
|---|---|
| H05K 7/20 | (2006.01) |
| F04D 27/00 | (2006.01) |
| G05B 15/02 | (2006.01) |
| H02M 7/42 | (2006.01) |
| H02M 7/02 | (2006.01) |

(52) U.S. Cl.
CPC ....... *H05K 7/20945* (2013.01); *F04D 27/004* (2013.01); *G05B 15/02* (2013.01); *H05K 7/20909* (2013.01); *H02M 7/02* (2013.01); *H02M 7/42* (2013.01)

(58) Field of Classification Search
CPC .. H05K 7/20945; F04D 27/004; G05B 15/02; G05B 15/20909
See application file for complete search history.

(56) References Cited

U.S. PATENT DOCUMENTS

| | | | |
|---|---|---|---|
| 5,250,786 A | 10/1993 | Kikuchi et al. | |
| 5,740,313 A * | 4/1998 | Ueda | B23K 1/005 219/497 |
| 6,278,080 B1 * | 8/2001 | Moriguchi | B23K 9/1056 219/130.1 |
| 7,746,016 B2 | 6/2010 | Ye et al. | |
| 8,018,186 B2 | 9/2011 | Frankel et al. | |
| 8,049,450 B2 | 11/2011 | Wei | |
| 9,207,732 B1 | 12/2015 | Chen et al. | |
| 9,764,406 B2 | 9/2017 | Lambert et al. | |

(Continued)

FOREIGN PATENT DOCUMENTS

| | | |
|---|---|---|
| CN | 204677481 U | 9/2015 |
| CN | 206839437 U | 1/2018 |

(Continued)

*Primary Examiner* — Vincent H Tran
(74) *Attorney, Agent, or Firm* — Edell, Shapiro & Finnan, LLC

(57) ABSTRACT

A power supply includes a casing; an AC-to-DC converter; an inverter electrically coupled to the AC-to-DC converter; a transformer having a primary side and a secondary side, wherein the inverter is electrically coupled to the primary side of the transformer; an output rectifier electrically coupled to the secondary side of the transformer; a fan, disposed in the casing and configured to remove heat from the casing generated by the AC-to-DC converter, the inverter and the output rectifier; and a fan controller configured to control when the fan is operational, wherein the fan controller is configured to execute a state machine that is configured to change states based at least on a dynamically adjustable counter.

18 Claims, 3 Drawing Sheets

(56) References Cited

U.S. PATENT DOCUMENTS

| | | | |
|---|---|---|---|
| 10,099,308 B2 | 10/2018 | Vogel et al. | |
| 2005/0111669 A1* | 5/2005 | Park | G05D 23/1919 |
| | | | 381/58 |
| 2010/0282728 A1 | 11/2010 | Cole | |
| 2012/0298644 A1* | 11/2012 | Lambert | B23K 9/0953 |
| | | | 219/130.31 |
| 2013/0112367 A1* | 5/2013 | Kooken | B23K 9/1006 |
| | | | 165/11.1 |
| 2016/0129520 A1* | 5/2016 | Schwartz | H01F 27/402 |
| | | | 219/130.1 |
| 2017/0022995 A1 | 1/2017 | Liu et al. | |
| 2017/0137990 A1* | 5/2017 | Forman | D06F 58/30 |
| 2017/0326674 A1* | 11/2017 | Dunbar | A61F 9/06 |
| 2017/0351306 A1 | 12/2017 | Kim et al. | |
| 2018/0339376 A1* | 11/2018 | Knoener | F24F 11/77 |

FOREIGN PATENT DOCUMENTS

| | | |
|---|---|---|
| CN | 108237305 A | 7/2018 |
| JP | 60238083 A | 11/1985 |

\* cited by examiner

US 10,939,593 B2

POWER SUPPLY FAN MANAGEMENT

FIELD OF THE DISCLOSURE

The present disclosure is directed to welding and cutting equipment and, more particularly, to techniques for controlling the operation of a cooling fan integrated with a power supply for welding and cutting equipment.

BACKGROUND OF THE DISCLOSURE

A power supply designed for welding or cutting includes an input-side AC-to-DC converter which converts a commercial AC voltage to a DC voltage. The DC voltage is applied to an inverter where it is converted to a high-frequency voltage, which, in turn, is applied to a voltage transformer. The voltage transformer transforms the high-frequency voltage to a high-frequency voltage having a predetermined value. The voltage-transformed high-frequency voltage from the transformer is converted back to a DC voltage in an output-side high-frequency-to-DC converter, e.g., a rectifier. The resulting DC voltage is applied to a load, e.g., a torch that operates near a workpiece.

The input-side AC-to-DC converter and the output-side high-frequency-to-DC converter (e.g., rectifier) each includes at least one diode. The inverter includes at least one semiconductor switching device, such as an IGBT.

Since the power supply includes an inverter, the power supply can employ smaller-sized reactors in the transformer and the output-side high-frequency-to-DC converter, enabling the downsizing of the power supply.

Such a downsized power supply can be disposed in a single casing. Although such a casing provides an aesthetically pleasing package, Joule heat generated by the aforementioned components tends to accumulate in the casing. In particular, the diodes used in the input-side and output-side AC-to-DC converters and the power semiconductor devices used in the inverter, generate a large amount of heat. Typically, a fan is disposed in the casing for the purpose of forcibly cooling such devices.

Fan operation in a welding power source, however, can introduce several negative by-products including (1) noise pollution in the work place, (2) increased dust accumulation inside the casing thereby impacting service life, and (3) increased wear on the fans themselves also causing decreased service life.

SUMMARY OF THE DISCLOSURE

A power supply includes a casing; an AC-to-DC converter; an inverter electrically coupled to the AC-to-DC converter; a transformer having a primary side and a secondary side, wherein the inverter is electrically coupled to the primary side of the transformer; an output rectifier electrically coupled to the secondary side of the transformer; a fan, disposed in the casing and configured to remove heat from the casing generated by the AC-to-DC converter, the inverter and the output rectifier; and a fan controller configured to control when the fan is operational, wherein the fan controller is configured to execute a state machine that is configured to change states based at least on a dynamically adjustable counter.

In another embodiment, a method is provided. The method includes detecting an arc powered by a power supply; incrementing a counter while the arc is being detected; determining whether a value of the counter is greater than a predetermined threshold; and when the value of the counter is greater than the predetermined threshold, turning on a fan to remove heat from a casing of the power supply.

BRIEF DESCRIPTION OF THE DRAWINGS

By way of example, embodiments of the disclosed systems and methods will now be described, with reference to the accompanying drawings, in which.

DETAILED DESCRIPTION

Figure 1:
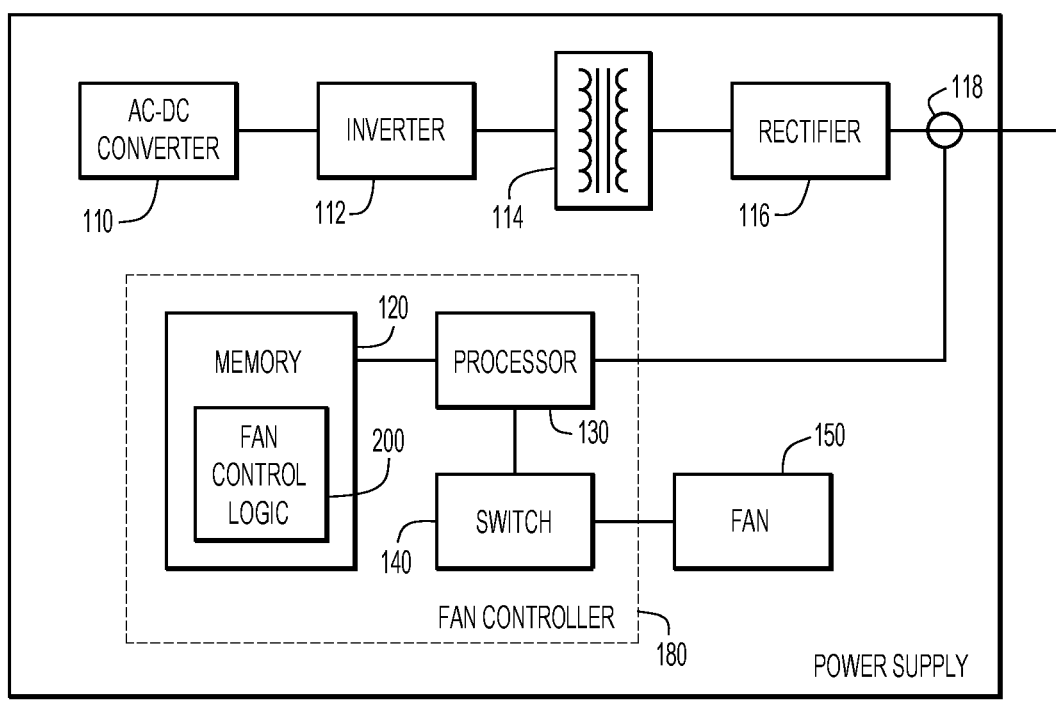
FIG. 1 depicts a block diagram of a power supply for a multi-process welding and cutting machine including a fan and fan control logic for operating the fan in accordance with an example embodiment.

FIG. 1 depicts a block diagram of a power supply for a multi-process welding and cutting machine including a fan and fan control logic for operating the fan in accordance with an example embodiment. Specifically, power supply 100 includes an AC-DC converter 110 connected to an inverter 112, which is connected to a primary side of a transformer 114. A secondary side of the transformer 114 is connected to a rectifier 116, which provides an output of the power supply.

A memory 120, which stores fan control logic 200, is in communication with a processor 130. The processor 130 may control a switch 140 that is used to control the operation of a fan (or fans) 150, by allowing electrical current to flow to a motor of the fan (not shown). The components described above are all mounted inside a casing 105, and the fan 150 itself is mounted in such a way so as to, when in operation, circulate ambient air inside the casing 105, thereby cooling the components that generate heat. The combination of the memory 120, fan control logic 200, processor 130, and switch 140 maybe collectively referred to as a fan controller 180. A current sensor 118 may provide, to processor 130, an indication of whether, e.g., weld current is flowing out of power supply 100, and which indication may be an indication of a welding or cutting (hereafter "welding") arc being present between a torch and a workpiece.

The processor 130 may include one or more processing units that are configured to load instructions (e.g., fan control logic 200) from memory 120. The memory 120 may include read only memory (ROM), random access memory (RAM), magnetic disk storage media devices, optical storage media devices, flash memory devices, electrical, optical, or other physical/tangible memory storage devices. In general, the memory 120 may include one or more tangible (non-transitory) computer readable storage media (e.g., a memory device) encoded with software or firmware comprising computer executable instructions, and when the instructions are executed (by the processor 130) they are able to perform the operations described herein.

In accordance with an embodiment, and at a high level, fan controller 180, which may implement a state machine, is configured to manage the operation of fan 150 using a dynamically adjustable counter (or simply "counter"), and an indication of the presence of a welding arc in such a way so as to minimize the fan's operation time without appreciably affecting the thermal quality of the system or the life of the electronic components that comprise the power supply 100. The term "arc" or "welding arc" is also meant to include an arc used for cutting or gouging. In accordance with one implementation, the fan controller 180 delays turning on the fan 150 until weld current has been detected for a long enough duration of time, to establish that a committed work scenario has commenced.

In this regard, the techniques include, depending on a state of the state machine, incrementing the counter, on a time-element-schedule (e.g., second(s) or fractions thereof), or decrementing the counter on a time-element-schedule (e.g., second(s) or fractions thereof). The operations of incrementing and decrementing the counter may be slowed down or sped up by applying one or more multipliers, depending of the state of the state machine. If the counter is above a given threshold, the switch 140 is controlled to cause fan 150 to operate.

For example, the counter may be incremented in real time, e.g., an increment of one per second, but decremented at one third that speed, i.e., the counter is decremented by one for each 3 seconds of elapsed time.

In an embodiment, after the welding action has completed (i.e., an arc is no longer detected), the fan controller 180 may be configured to provide a fan 'on' condition until the counter decrements to zero. If a welding arc is detected before the counter reaches zero, the counter is again incremented. Notably, the described implementations for controlling the operation of a fan do not rely on thermal detection. Rather, fan operation is tied to a value of a counter, and the counter is incremented or decremented as explained above, and in more detail below in connection with FIG. 2.

Figure 2:
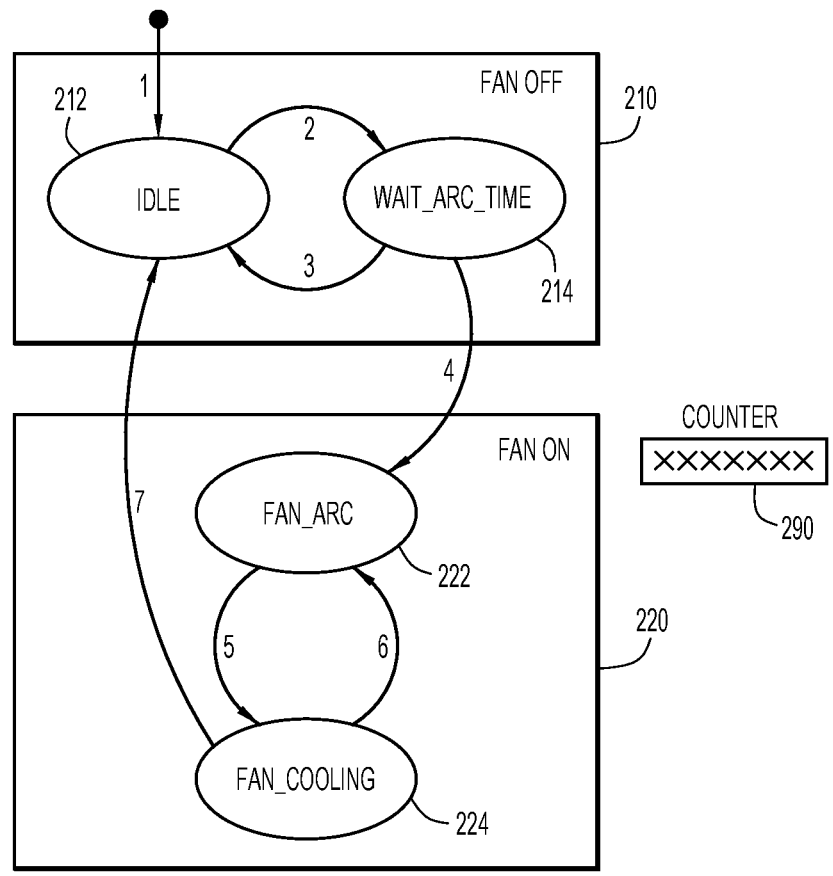
FIG. 2 depicts a state machine implemented by the fan control logic in accordance with an example embodiment.

FIG. 2 depicts a state machine implemented by the fan control logic 180 in accordance with an example embodiment. The state machine of FIG. 2 includes a fan OFF state 210 and a fan ON state 220. The fan OFF state 210 includes two sub-states including an idle state 212 and a wait_arc_time state 214. The fan ON state 220 includes two sub-states including a fan_arc state 222 and a fan_cooling state 224.

In idle state 212, the fan 150 is off, no welding arc is detected, and a value of a counter 290 is zero. That is, the idle state 212 may be considered the state at which the welding power supply 100 is initially turned on, no incrementing or decrementing of the counter 290 has occurred (or is occurring) and no welding (or cutting) has yet taken place. As will be more fully understood from the discussion below, the state machine can transition from the idle state 212, but return to that state at a later time.

In the weight_arc_time state 214, the fan 150 is off, and a value of the counter is greater than zero, but below a predetermined threshold. The counter is incremented while a welding arc is detected, and decremented when no welding arc is detected.

In the fan arc state 222, the fan is on, the counter is greater than zero, a welding arc is detected and the counter is above zero. The counter may be incremented on a one-to-one basis (e.g., one second equals one increment to the counter) or using a multiplier where the counter is incremented more than, or less than, once for each second, for example.

In the fan_cooling_state 224, the fan is on, the counter is above zero, a welding arc is not detected, and the counter is decremented. Decrementing can proceed on a one-to-one basis (e.g., one second equals one decrement to the counter) or using a multiplier where the counter is decremented less than or more than once for each second, for example.

FIG. 2 also shows state transition numbers 1-7. Each state transition number and its corresponding description is set forth below.
1. Fan system initialized.
2. Arc detected.
3. Counter reaches zero.
4. Counter exceeds fan start threshold.
5. Arc extinguished (i.e., no longer detected).
6. Arc detected.
7. Counter reaches zero.

The following is an example of operations of the state machine shown in FIG. 2 employing the state transitions 1-7. At state transition number 1, the power supply 100 is, e.g., turned on for the first time, causing the state machine to be placed into the idle state 212. When a welding arc is detected at state transition number 2, the state machine transitions to the wait_arc_time state 214. Fan control logic 200 may become aware of a welding arc by, for example, monitoring the output current of the power supply, receiving a torch trigger state, monitoring one or more voltages of the power supply, receiving an indication from other logic being executed by processor 130, and/or monitoring the consumption of power by the power supply itself, delivery of power.

In the wait_arc_time state 214, and while an arc continues to be detected, the counter begins to increment in accordance with a predetermined time-based periodicity. For example, the counter maybe incremented by one for each second that elapses while in the wait_arc_time state 214. It is noted that how quickly the counter is incremented may also be dependent on how much power is being supplied by the power supply. For example, fan controller 180 may be configured to monitor output current and voltage of the power supply 100 and increase a value of a multiplier used to accelerate the counter in the wait_arc_state. Such a multiplier may be a first order multiplier, or may be a second order multiplier. In the latter case, the first order multiplier might be based on geographic area, e.g., typical ambient temperature, and/or mains input voltage.

Also, while still in wait_arc_time state 214, if the welding arc is no longer detected, the counter begins to be decremented. Decrementing the counter may be at the same rate as the rate the counter was incremented while the arc was being detected, or may be at a different rate. If the counter reaches zero while in the wait_arc_time state 214, then state transition number 3 causes the state machine to move back to the idle state 212.

However, if the counter reaches and/or exceeds the fan start threshold value, then at state transition number 4, the state machine transitions to fan_arc state 222. During the fan_arc state 222 the fan 150 is turned on and the counter continues to be incremented either according to a one-to-one ratio with the time-based periodicity, or in accordance with a predetermined multiplier (which could be greater than or less than 1, and may be dynamically adjustable).

When the welding arc is no longer detected, then state transition number 5 causes the state machine to transition to fan_cooling state 224. During the fan_cooling state 224 the counter is decremented either according to a one-to one ratio with the time-based periodicity, or in accordance with a predetermined multiplier (which could be greater than or less than 1).

If a welding arc is reignited, i.e., a welding arc is (again) detected, then state transition number 6 causes the state machine to move back to fan_arc state 222.

On the other hand, if while in the fan_cooling state 224 the counter reaches zero, then state transition number 7 returns the state machine to idle state 212.

Thus, as one of ordinary skill in the art will appreciate, when the power supply is first turned on, but no welding is yet taking place, the counter is idle, and no incrementing or decrementing occurs. However, once welding begins the counter begins to increment, but the fan is not yet turned on. Such a sequence of events accounts for a scenario in which a very short weld might take place that does not warrant operation of the fan. On the other hand, after some predetermined amount of time, i.e., when the counter reaches a fan start threshold value, the fan is turned on and the counter is either incremented while the welding arc is detected or decremented while the welding arc is no longer detected. If the counter eventually reaches zero while in the fan ON state 220, the fan will be turned off and the state machine will be returned to the idle state 212.

In accordance with an embodiment, the fan start threshold value (above which state machine transitions to the fan ON state 220), and the incrementing and decrementing multipliers may all be adjustable, and need not be the same in each state. For example, a decrementing multiplier used in the wait-arc_time state 214 may cause the counter to decrement more slowly than the decrementing that occurs in the fan_cooling state 224.

The values selected for the fan start threshold and the respective incrementing and decrementing multipliers may be established uniquely for individual cases, e.g., rated power of the power supply, and/or geographic location of operation (i.e., cooler or warmer climates). These values may also be adjustable in the field, or at least by a service technician.

Figure 3:
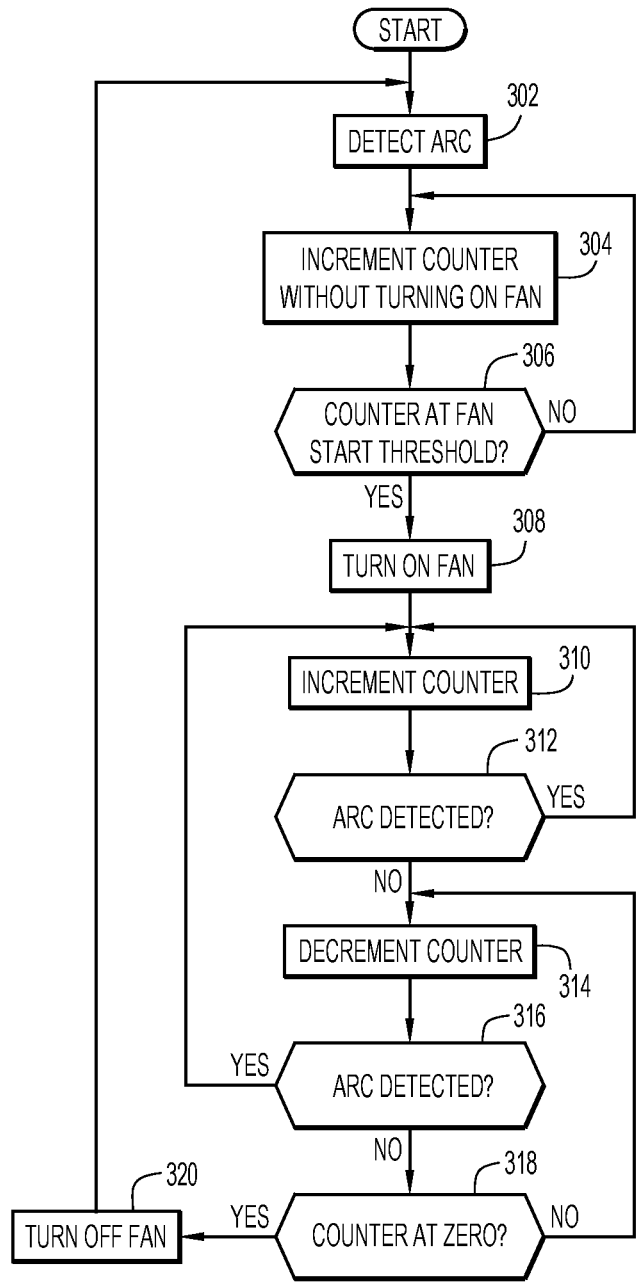
FIG. 3 is a flow chart illustrating a series of operations for controlling a fan in a power supply for a multi-process welding and cutting machine in accordance with an example embodiment.

FIG. 3 is a flow chart illustrating a series of operations for controlling a fan in a power supply for a multi-process welding and cutting machine in accordance with an example embodiment. The sequence of operations may be considered as one possible sequence of transitions through the states of the state machine of FIG. 2.

Referring to FIG. 3, the sequence starts with 302 at which an arc is detected. At 304, a counter is incremented without turning on the fan of the power supply. At 306, it is determined whether the counter is at a fan start threshold. If not, the sequence returns to operation 304. If the counter has reached the fan start threshold at 306, then, at 308, the fan is turned on.

At 310, the counter is incremented. At 312, it is determined whether a welding arc is detected. If yes, then the counter continues to be incremented. If the welding arc has been distinguished, then, at 312, the welding arc is no longer detected and, at 314, the counter is decremented. At 316, it is again determined whether the arc is detected. If yes, then the sequence returns to operation 310. If the welding arc is no longer detected, it is determined, at 318, whether the counter has reached zero. If not, the sequence returns to 314 where the counter continues to be decremented.

If the counter has, in fact, reached zero at 318, then, at 320, the fan is turned off and the sequence returns to operation 302 where the system is effectively in the idle state 212 shown in FIG. 2.

Thus, those skilled in the art will appreciate that the counter-based fan management described herein need not rely on thermal sensors, and can provide improved fan management beyond a simple on/off control tied to, e.g., detection of weld current, no matter how little.

The above description is intended by way of example only. Various modifications and structural changes may be made therein without departing from the scope of the concepts described herein and within the scope and range of equivalents of the claims.

What is claimed is:

1. A power supply, comprising:
   a casing;
   an AC-to-DC converter;
   an inverter electrically coupled to the AC-to-DC converter;
   a transformer having a primary side and a secondary side, wherein the inverter is electrically coupled to the primary side of the transformer;
   an output rectifier electrically coupled to the secondary side of the transformer;
   a fan, disposed in the casing and configured to remove heat from the casing generated by the AC-to-DC converter, the inverter and the output rectifier; and
   a fan controller configured to control when the fan is operational, wherein the fan controller is configured to execute a state machine that is configured to change states based at least on a dynamically adjustable counter, which is incremented when an arc, powered by the power supply, is detected.

2. The power supply of claim 1, wherein the dynamically adjusted counter is decremented when an arc, powered by the power supply, is not detected.

3. The power supply of claim 1, wherein the state machine comprises two fan OFF states.

4. The power supply of claim 3, wherein the two fan OFF states include an idle state, and a wait_arc_time state during which the dynamically adjustable counter is incremented while an arc, powered by the power supply, is detected, and the dynamically adjustable counter is decremented while the arc is not detected.

5. The power supply of claim 1, wherein the state machine comprises two fan ON states.

6. The power supply of claim 5, wherein the two fan ON states include a fan_arc state during which the dynamically adjustable counter is incremented while an arc, powered by the power supply, is detected, and a fan_cooling state during which the dynamically adjustable counter is decremented while the arc is not detected.

7. The power supply of claim 6, wherein when the state machine is in the fan_cooling state and the dynamically adjusted counter reaches zero, the fan is turned off.

8. The power supply of claim 6, wherein when the state machine is in the fan_cooling state, and the arc is detected, the state machine transitions to the fan_arc state.

9. The power supply of claim 1, wherein the fan controller comprises a memory and a processor.

10. A method comprising:
    detecting an arc powered by a power supply;
    incrementing a counter while the arc is being detected;
    determining whether a value of the counter is greater than a predetermined threshold;
    when the value of the counter is greater than the predetermined threshold, turning on a fan to remove heat from a casing of the power supply; and
    when the arc is no longer being detected, decrementing the counter.

11. The method of claim 10, further comprising:
    incrementing the counter while the fan is on.

12. The method of claim 11, further comprising:
    determining whether the value of the counter is zero, and if the value of the counter is zero, turning off the fan.

13. The method of claim 11, wherein a rate of incrementing the counter is different from a rate of decrementing the counter.

14. The method of claim 10, wherein incrementing the counter is based on a time-element-schedule.

15. A non-transitory computer readable storage media encoded with instructions that, when executed by a processor, cause the processor to:
- detect an arc powered by a power supply;
- increment a dynamically adjustable counter while the arc is being detected;
- determine whether a value of the dynamically adjustable counter is greater than a predetermined threshold; and
- when the value of the dynamically adjustable counter is greater than the predetermined threshold, turn on a fan to remove heat from a casing of the power supply.

16. The non-transitory computer readable storage media of claim 15, the instructions further including instructions that, when executed by the processor, cause the processor to increment the dynamically adjustable counter while the fan is on.

17. The non-transitory computer readable storage media of claim 16, the instructions further including instructions that, when executed by the processor, cause the processor to determine whether the arc is still being detected, and when the arc is no longer being detected decrement the dynamically adjustable counter.

18. The non-transitory computer readable storage media of claim 17, the instructions further including instructions that, when executed by the processor, cause the processor to determine whether the value of the dynamically adjustable counter is zero, and if the value of the dynamically adjustable counter is zero, turn off the fan.

* * * * *